United States Patent
Nguyen et al.

[11] Patent Number: 5,900,740
[45] Date of Patent: May 4, 1999

[54] SYSTEM AND METHOD FOR ADJUSTING A VOLTAGE

[75] Inventors: Quan Nguyen; Ivan Vo, both of Austin, Tex.

[73] Assignee: International Business Machines Corporation, Armonk, N.Y.

[21] Appl. No.: 08/574,466

[22] Filed: Dec. 15, 1995

[51] Int. Cl.[6] .............................................. H03K 19/003
[52] U.S. Cl. .................................. 326/21; 326/30; 326/33
[58] Field of Search ................................ 326/21, 26, 27, 326/30, 33–34, 83

[56] References Cited

U.S. PATENT DOCUMENTS

| 5,057,711 | 10/1991 | Lee et al. ................................... 326/27 |
| 5,122,690 | 6/1992 | Bianchi ................................... 326/27 X |
| 5,153,457 | 10/1992 | Martin et al. .......................... 326/27 X |
| 5,248,907 | 9/1993 | Lin et al. ............................... 326/27 X |
| 5,534,789 | 7/1996 | Ting .......................................... 326/21 |

*Primary Examiner*—Edward P. Westin
*Attorney, Agent, or Firm*—Casimer K. Salys; Michael A. Davis, Jr.

[57] ABSTRACT

First current is conducted through a first path to adjust a voltage at a node toward a predetermined level in response to the voltage being within a first subrange of voltages. Second current is conducted through a second path to adjust the voltage at the node toward the predetermined level in response to the voltage being within a second subrange of voltages.

19 Claims, 2 Drawing Sheets

SYSTEM AND METHOD FOR ADJUSTING A VOLTAGE

TECHNICAL FIELD

This patent application relates in general to electronic circuitry and in particular to a method and system for adjusting a voltage. BACKGROUND Multiple integrated electronic circuits are frequently connected to one another through a bidirectional tri-state input/output ("I/O") bus. Through such a bus, a signal can be driven and received by multiple circuits. In many systems, it is preferable to maintain an existing previously-driven logic state (e.g. a low voltage logic zero (0) "false" state) on the bus during a period when no circuit is actively driving the bus.

To help achieve this goal, according to one conventional technique, the bus includes one or more pull-up resistors. Nevertheless, such a technique fails to continually maintain a high voltage logic one (1) "true" state. Instead, such a technique merely slows a gradual decay of such a high voltage state and is primarily useful to help maintain a low voltage state.

Alternatively, "bus keeper" (or "voltage clamping") circuitry may be used to maintain the logic state. Nevertheless, conventional bus keeper circuitry techniques are impractical for certain applications where a relatively low-voltage (e.g. voltage ranging between 0 volts and 3.3 volts) circuit is connected to a higher-voltage (e.g. voltage ranging between 0 volts and 5.0 volts) circuit. In some cases, this is due to high currents and/or overloads which might result on one or more devices within the bus keeper circuitry.

Thus, a need has arisen for a method and system for adjusting a voltage, in which a high voltage logic state can be continually maintained. Also, a need has arisen for a method and system for adjusting a voltage, in which a logic state can be more practically maintained between a relatively low-voltage circuit connected to a higher-voltage circuit.

SUMMARY

First current is conducted through a first path to adjust a voltage at a node toward a predetermined level in response to the voltage being within a first subrange of voltages. Second current is conducted through a second path to adjust the voltage at the node toward the predetermined level in response to the voltage being within a second subrange of voltages.

It is a technical advantage of the present inventions that a high voltage logic state can be continually maintained.

It is another technical advantage of the present inventions that a logic state can be more practically maintained between a relatively low-voltage circuit connected to a higher-voltage circuit.

BRIEF DESCRIPTION OF THE DRAWINGS

An illustrative embodiment of the present inventions and their advantages are better understood by referring to the following descriptions and accompanying drawings, in which.

DETAILED DESCRIPTION

Figure 1:
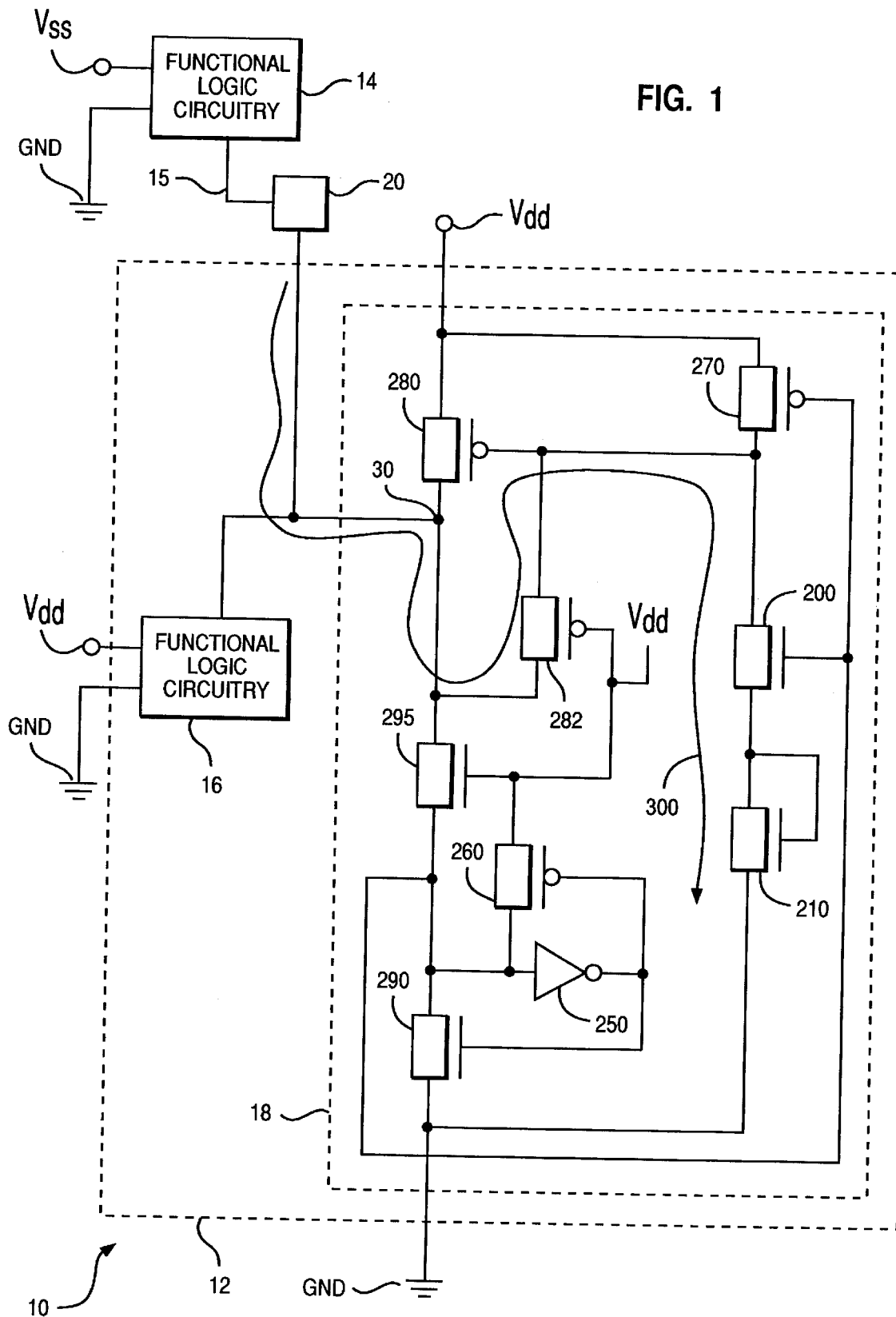
FIG. 1 is a schematic electrical circuit diagram of a system for adjusting a voltage, according to the illustrative embodiment.
Figure 2:
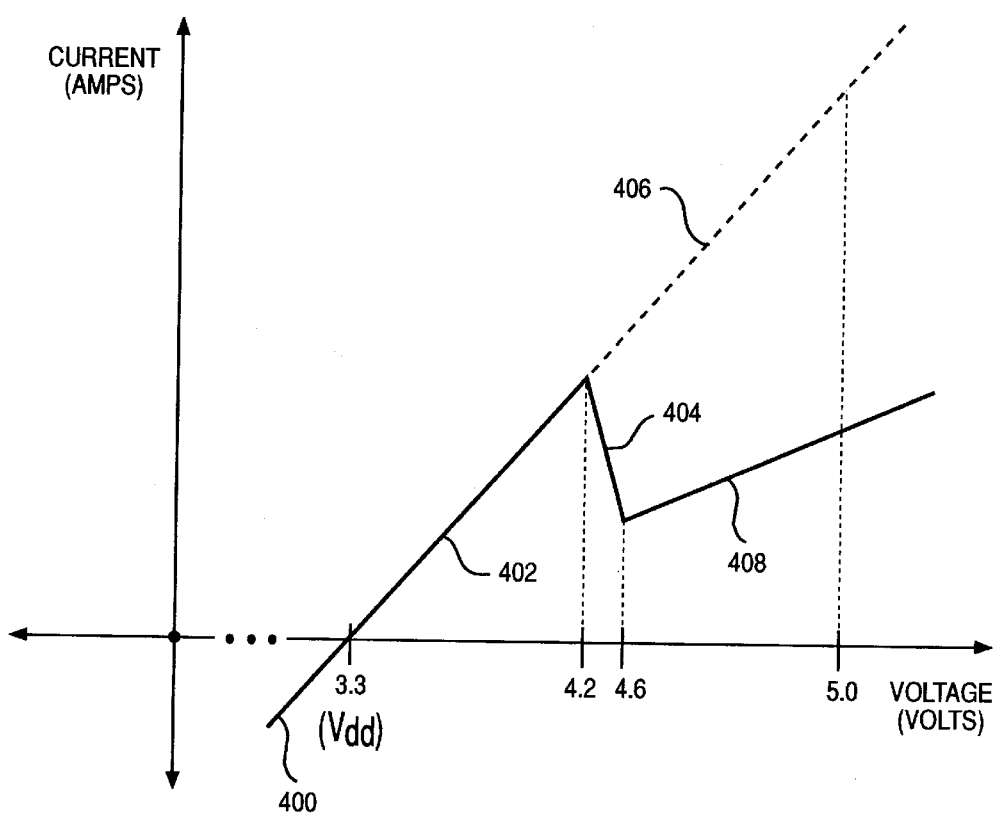
FIG. 2 is an example plot of current through bus keeper circuitry of the system of FIG. 1 as a function of voltage at a node of the bus keeper circuitry.

An illustrative embodiment of the present inventions and their advantages are better understood by referring to FIGS. 1–2 of the drawings, like alphanumeric characters being used for like and corresponding parts of the accompanying drawings.

FIG. 1 is a schematic electrical circuit diagram of a system, indicated generally at 10, for adjusting a voltage, according to the illustrative embodiment. System 10 includes an integrated circuit (indicated by dashed enclosure 12), functional logic circuitry 14, and a bus 15. In the illustrative embodiment, circuitry 14 is a single integrated circuit.

Integrated circuit 12 is a single integrated circuit which includes functional logic circuitry 16 and bus keeper circuitry (indicated by dashed enclosure 18). As shown in FIG. 1, each of circuitry 16 and 18 is connected to a voltage supply node Vdd and to a voltage reference node GND. Circuitry 14 is connected to a voltage supply node Vss and to voltage reference node GND.

In the illustrative embodiment, voltage supply node Vdd has a voltage of approximately 3.3 volts relative to voltage reference node GND. By comparison, voltage supply node Vss has a voltage of approximately 5.0 volts relative to voltage reference node GND.

Circuitry 14 is coupled through bus 15 to a metallic terminal pad 20. In the illustrative embodiment, terminal pad 20 resides within a plastic package (not shown in FIG. 1) which encapsulates integrated circuit 12. Pad 20 is further connected to circuitry 16 and to a node 30 of circuitry 18.

Circuitry 18 includes n channel field effect transistors 200, 210, 290 and 295. Further, circuitry 18 includes p channel field effect transistors 260, 270, 280 and 282. Also, circuitry 18 includes a complementary metal oxide semiconductor ("CMOS") inverter 250.

Node 30 is connected to a first source/drain of transistor 280, to a first source/drain of transistor 282, and to a drain of transistor 295. A second source/drain of transistor 280 is connected to a source of transistor 270 and to Vdd. A gate of transistor 280 is connected to a second source/drain of transistor 282, to a drain of transistor 270, and to a drain of transistor 200.

Vdd is further connected to a gate of transistor 282, to a gate of transistor 295, and to a source of transistor 260. A source of transistor 295 is connected to an input of inverter 250, to a drain of transistor 260, to a drain of transistor 290, to a gate of transistor 200, and to a gate of transistor 270. Accordingly, transistors 200 and 270 operate together as CMOS inverter which is substantially identical in design and implementation to CMOS inverter 250.

An output of inverter 250 is connected to a gate of transistor 260 and to a gate of transistor 290. The source of transistor 290 is connected to GND. A source of transistor 200 is connected to a drain of transistor 210.

The drain of transistor 210 is connected to a gate of transistor 210. A source of transistor 210 is connected to GND. Accordingly, transistor 210 operates as a diode, which conducts current from its drain to its source, and which has a voltage at its drain of approximately 0.5 volts relative to a voltage at its source.

Circuitry 14 operates to selectively alternate between (a) being in a high impedance state with respect to pad 20 so that circuitry 14 is not driving a logic state through bus 15 and (b) actively driving a logic state through bus 15 to pad 20. When circuitry 14 actively drives a logic state through bus 15 to pad 20, circuitry 14 drives either a low voltage (approximately 0 volts) logic zero (0) "false" state or a high voltage (approximately 5.0 volts) logic one (1) "true" state. Similarly, circuitry 16 operates to selectively alternate between (a) being in a high impedance state with respect to pad 20 and (b) actively driving a logic state to pad 20. When circuitry 16 actively drives a logic state to pad 20, circuitry 16 drives either a low voltage (approximately 0 volts) logic zero (0) "false" state or a high voltage (approximately 3.3 volts) logic one (1) "true" state.

Accordingly, circuitry 14 and circuitry 16 are tri-state devices with respect to pad 20. More specifically, ach of circuitry 14 and circuitry 16 operates to electively alternate between one of three possible states with respect to pad 20. These three possible states are:

1. an actively driven logic one (1) "true" state,
2. an actively driven logic zero (0) "false" state, and
3. a high impedance state.

In a significant aspect of the illustrative embodiment, the logic one (1) "true" state driven by circuitry 14 is significantly higher in voltage than the logic one (1) "true" state driven by circuitry 16 and latched by circuitry 18. Thus, the voltage level of Vss is significantly farther away from the voltage level of GND (and the low voltage logic state) than is the voltage level of Vdd.

Circuitry 18 operates to maintain an existing logic state on pad 20 (and likewise therefore also on bus 15) during a period of time when both circuitry 14 and circuitry 16 are in the high impedance state with respect to pad 20 (i.e. neither circuitry -14 nor circuitry 16 is actively driving a logic state to pad 20). Such an existing logic state is previously driven by circuitry 14 or circuitry 16.

Each of transistors 200, 210, 290, 295, 260 and 270 has a respective channel width/length ratio of 1:1, as do each of the two transistors (not shown for clarity) which together form CMOS inverter 250. By comparison, each of transistors 280 and 282 has a respective channel width/length ratio of 3:1. Transistors 280 and 282 are relatively large in order to achieve high current sink/source capability for fast voltage clamping action, and to more readily maintain an existing logic state on terminal pad 20 as discussed further hereinbelow.

Since the gate of transistor 295 is connected to Vdd, transistor 295 (a representative one of the n channel transistors of circuitry 18) turns substantially on if Vdn>Vsn while (Vgn−Vsn)>Vt, where:

Vdn is a voltage at the drain of transistor 295 relative to GND,

Vsn is a voltage at the source of transistor 295 relative to GND,

Vgn is a voltage at the gate of transistor 295 relative to GND, and

Vt is a threshold voltage which is equal to approximately 0.5 volts.

Similarly, if the gate of transistor 280 has a logic 0 state (i.e. if the gate of transistor 280 has a voltage of approximately 1.4 volts or less relative to GND), then transistor 280 (a representative one of the p channel transistors of circuitry 18) turns substantially on if Vsp>Vdp while (Vsp−Vgp)>Vt, where:

Vdp is a voltage at the drain of transistor 280 relative to GND,

Vsp is a voltage at the source of transistor 280 relative to GND, and

Vgp is a voltage at the gate of transistor 280 relative to GND.

Accordingly, if node 30 has a logic 0 state, then the output of inverter 250 is a logic 1 state, thereby substantially:

turning on transistor 290, turning off transistor 260, and turning off transistor 280, such that circuitry 18 latches a low voltage logic 0 state at node 30 and at the input of inverter 250.

By comparison, circuitry 18 latches a high voltage logic 1 state at node 30 if node 30 initially has a voltage of approximately 1.8 volts or more relative to GND. In an alternative embodiment, circuitry 18 latches a logic 1 state at node 30 if node 30 initially has a voltage of approximately 2.2 volts or more relative to GND.

FIG. 2 is an example plot of current through circuitry 18 as a function of voltage at node 30. FIG. 2 is not necessarily drawn to scale. Referring simultaneously to FIGS. 1 and 2, if node 30 initially has a voltage (relative to GND) between approximately 1.8 volts and the voltage at Vdd (i.e. approximately 3.3 volts), then the output of inverter 250 is a logic 0 state, thereby substantially:

turning off transistor 290, turning on transistor 260, and turning on transistor 280, such that circuitry 18 eventually increases the voltage at node 30 (and at the input of inverter 250) to be approximately 3.3 volts relative to GND. In this manner, circuitry 18 eventually latches (or "keeps") a voltage at node 30 (and at the input of inverter 250) of approximately 3.3 volts relative to GND, and circuitry 18 continually maintains such a latched voltage until the voltage at terminal pad 20 is actively driven to a different logic state by either circuitry 14 or circuitry 16.

In such a situation, line segment 400 of FIG. 2 shows how current through transistor 280 increases as a function of voltage increasing at node 30 up to approximately 3.3 volts, where current is defined as a negative quantity as it flows along a path from Vdd through transistor 280 to node 30.

Notably, if node 30 has a lower voltage than Vdd, then:

the first source/drain (connected to node 30) of transistor 280 operates as a drain, and the second source/drain of transistor 280 operates as a source.

By comparison, if node 30 has a higher voltage than Vdd, then:

the first source/drain of transistor 280 (connected to node 30) operates as a source, and the second source/drain of transistor 280 operates as a drain.

Thus, line segment 402 of FIG. 2 shows how current through transistor 280 continues to increase as a function of voltage increasing at node 30 beyond approximately 3.3 volts up to approximately 4.2 volts, where current is defined as a positive quantity as it flows along a path from node 30 through transistor 280 to Vdd.

Accordingly, if node 30 initially has a voltage (relative to GND) between the voltage at Vdd (i.e. approximately 3.3 volts) and approximately 4.2 volts, then the output of inverter 250 is a logic 0 state, thereby substantially:

turning off transistor 290, turning on transistor 260, and turning on transistor 280.

In such a situation, so long as node 30 has a voltage between the voltage at Vdd and approximately 4.2 volts, current is positive as it flows along the path from node 30 through transistor 280 to Vdd, such that circuitry 18 eventually reduces the voltage at node 30 (and at the input of inverter 250) to be approximately 3.3 volts relative to GND. In this manner, circuitry 18 eventually latches (or "keeps") a voltage at node 30 (and at the input of inverter 250) of approximately 3.3 volts relative to GND, and circuitry 18 continually maintains such a latched voltage until the voltage at terminal pad 20 is actively driven to a different logic state by either circuitry 14 or circuitry 16. Since transistor 280 is relatively large, it achieves high current sink/source capability for fast voltage clamping action.

For transistor 282, in normal operation of circuitry 18, the first source/drain (connected to node 30) of transistor 282 operates as a source, and the second source/drain of transistor 282 operates as a drain. Nevertheless, transistor 282 is turned substantially off until Vsp (i.e. the voltage at node 30 relative to GND) for transistor 282 is greater than Vt (i.e. approximately 0.5 volts) plus Vgp (i.e. the voltage at Vdd, approximately 3.3 volts) for transistor 282.

In the illustrative embodiment, if (Vsp−Vgp)>Vt, then transistor 282 turns substantially on because:

Vgp=approximately 3.3 volts (since the gate of transistor 282 is connected to Vdd), and Vt=approximately 0.5 volts, so Vsp is greater than approximately 3.8 volts; and prior to transistor 282 turning substantially on, Vdp is not greater than the voltage at Vdd, so Vsp>Vdp.

When transistor 282 turns substantially on in this manner, current flows along a path 300 from node 30 through transistors 282, 200 and 210 to GND.

As transistor 282 turns substantially on, the voltage at the gate of transistor 280 gradually increases. As the voltage at node 30 increases beyond approximately 4.2 volts, transistor 280 begins turning off. As the voltage at node 30 increases beyond approximately 4.6 volts, transistor 280 turns substantially off. Nevertheless, transistor 260 remains substantially on, and transistor 290 remains substantially off.

Accordingly, line segment 404 of FIG. 2 shows how the combined current through transistors 280 and 282 begins to decrease as a function of voltage increasing at node 30 beyond approximately 4.2 volts up to approximately 4.6 volts, where current is defined as a positive quantity as it flows along:

the path from node 30 through transistor 280 to Vdd; and path 300 from node 30 through transistors 282, 200 and 210 to GND.

In such a situation, circuitry 18 eventually reduces the voltage at node 30 (and at the input of inverter 250) to be approximately 3.3 volts relative to GND. In this manner, circuitry 18 eventually latches (or "keeps") a voltage at node 30 (and at the input of inverter 250) of approximately 3.3 volts relative to GND, and circuitry 18 continually maintains such a latched voltage until the voltage at terminal pad 20 is actively driven to a different logic state by either circuitry 14 or circuitry 16.

By comparison, in the absence of transistor 282, dashed line segment 406 of FIG. 2 shows how current (flowing along the path from node 30 through transistor 280 to Vdd) would have continued to increase as a unction of voltage increasing at node 30 beyond approximately 4.2 volts. This is because resistance is higher along path 300 (from node 30 through transistors 282, 200 and 210 to GND), as compared to resistance along the path from node 30 through transistor 280 to Vdd. The higher resistance along path 300 results in large measure from the appropriate relatively small sizing of transistors 200 and 210; as mentioned hereinabove in connection with FIG. 1, each of transistors 200 and 210 has a respective channel width/length ratio of 1:1.

By directing current along the higher resistance path 300 (instead of the path from node 30 through transistor 280 to Vdd), current is lower than it would be otherwise if transistor 282 were not present. For example, line segment 408 of FIG. 2 shows how current along higher resistance path 300 increases as a function of voltage increasing at node 30 beyond approximately 4.6 volts. Significantly, a slope of line segment 408 is less than a slope of dashed line segment 406.

In such a situation where the voltage at node 30 is higher than approximately 4.6 volts, circuitry 18 eventually reduces the voltage at node 30 (and at the input of inverter 250) to be approximately 3.3 volts relative to GND. In this manner, circuitry 18 eventually latches (or "keeps") a voltage at node 30 (and at the input of inverter 250) of approximately 3.3 volts relative to GND, and circuitry 18 continually maintains such a latched voltage until the voltage at terminal pad 20 is actively driven to a different logic state by either circuitry 14 or circuitry 16.

Accordingly, circuitry 18 has relatively low current requirements. This is particularly advantageous, because conventional CMOS bidirectional tri-state I/O "bus keeper" circuitry fails to provide alternate low-current path 300. Thus, conventional "bus keeper" circuitry results in higher current drain when a low-voltage circuit (such as circuitry 18) is driven to a high voltage logic state by a higher-voltage circuit (such as circuitry 14). By comparison, circuitry 18 advantageously imposes a more practical current drain when terminal pad 20 is driven to a high voltage logic state by circuitry 14, even though Vss of circuitry 14 has a significantly higher voltage than Vdd of circuitry 18. Since circuitry 18 has relatively low current requirements, it consumes less power, dissipates less heat, and has less noise relative to conventional "bus keeper" circuitry.

Moreover, circuitry 18 ensures that a signal at terminal pad 20 is not applied directly to the gate of any transistor device within circuitry 18. In this manner, transistor devices within circuitry 18 are less subject to malfunctioning and/or damage resulting from a high voltage signal at terminal pad 20.

In summary, as discussed further hereinabove, system 10 includes node 30 which has a voltage. Transistors 295 and 290 are coupled to node 30 for adjusting the voltage at node 30 toward approximately 0 volts (the predetermined voltage level of GND which has a low voltage logic state) in response to the voltage at node 30 being within a range of voltages (approximately 1.4 volts or less) having the low voltage logic state. By comparison, transistors 280 and 282 are coupled to node 30 for adjusting the voltage at node 30 toward approximately 3.3 volts (the predetermined voltage level of Vdd which has a high voltage logic state) in response to the voltage at node 30 being within a range of voltages (approximately 1.8 volts or more) having the high voltage logic state.

More particularly, transistor 280 conducts first current through a first path (the path from node 30 through transistor 280 to Vdd) to adjust the voltage at node 30 toward approximately 3.3 volts in response to the voltage at node 30 being within a first subrange of voltages (approximately 1.8 volts through approximately 4.6 volts) having the high voltage logic state. By comparison, transistor 282 conducts second current through a second path (path 300 from node 30 through transistors 282, 200 and 210 to GND) to adjust the voltage at node 30 toward approximately 3.3 volts in response to the voltage at node 30 being within a second subrange of voltages (approximately 3.8 volts or more) having the high voltage logic state. Notably, the first and second subranges of voltages partially overlap in the subrange of voltages between approximately 3.8 volts and approximately 4.6 volts, so that both transistors 280 and 282 are at least partially turned on in response to the voltage at node 30 being within this overlapping subrange of voltages (between approximately 3.8 volts and approximately 4.6 volts) having the high voltage logic state.

Although an illustrative embodiment of the present inventions and their advantages have been described in detail hereinabove, it has been described as example and not as limitation. Various changes, substitutions and alterations can be made in the illustrative embodiment without departing from the breadth, scope and spirit of the present inventions. The breadth, scope and spirit of the present inventions should not be limited by the illustrative embodiment, but should be defined only in accordance with the following claims and equivalents thereof.

What is claimed is:

1. A system, comprising:
   a node having a voltage;
   first circuitry coupled to said node for adjusting said voltage toward a predetermined first level having a first logic state if said voltage is within a range of voltages having said first logic state;
   second circuitry coupled to said node for adjusting said voltage toward a predetermined second level having a second logic state if said voltage is within a range of voltages having said second logic state, said second circuitry comprising:
      third circuitry for conducting first current through a first path to adjust said voltage toward said second level if said voltage is within a first subrange of voltages having said second logic state; and
      fourth circuitry for conducting second current through a second path to adjust said voltage toward said second level if said voltage is within a second subrange of voltages having said second logic state.

2. The system of claim 1 and further comprising fifth circuitry coupled to said node for driving said voltage at said node to have a selected one of said first and second logic states.

3. The system of claim 2 wherein said fifth circuitry is operable to drive said voltage at said node to a driven level which is significantly farther away from said first logic state than is said second level.

4. The system of claim 3 wherein said driven level has said second logic state.

5. A system, comprising:
   a node having a voltage;
   circuitry coupled to said node for adjusting said voltage toward a predetermined level in response to said voltage being within a range of voltages, comprising:
      a first path for conducting first current to adjust said voltage toward said predetermined level in response to said voltage being within a first subrange of voltages within said range; and
      a second path for conducting second current to adjust said voltage toward said predetermined level in response to said voltage being within a second subrange of voltages within said range.

6. The system of claim 5 wherein said range of voltages has a second logic state, and wherein a different range of voltages has a first logic state.

7. The system of claim 6 wherein said predetermined level has said second logic state.

8. The system of claim 7 and further comprising additional circuitry coupled to said node for driving said voltage at said node to have said second logic state.

9. The system of claim 8 wherein said additional circuitry is operable to drive said voltage at said node to a driven level which is significantly farther away from said first logic state than is said predetermined level.

10. The system of claim 9 wherein said driven level has said second logic state.

11. The system of claim 7 and further comprising additional circuitry coupled to said node for adjusting said voltage toward a different predetermined level having said first logic state in response to said voltage being within said different range of voltages having said first logic state.

12. A method, comprising:
    conducting first current through a first path to adjust a voltage at a node toward a predetermined level in response to said voltage being within a first subrange of voltages; and
    conducting second current through a second path to adjust said voltage at said node toward said predetermined level in response to said voltage being within a second subrange of voltages.

13. The method of claim 12 wherein said first and second subranges are within a range of voltages.

14. The method of claim 13 wherein said range of voltages has a second logic state, and wherein a different range of voltages has a first logic state.

15. The method of claim 14 wherein said predetermined level has said second logic state.

16. The method of claim 15 and further comprising driving said voltage at said node to have said second logic state.

17. The method of claim 16 wherein driving step comprises driving said voltage at said node to a driven level which is significantly farther away from said first logic state than is said predetermined level.

18. The method of claim 17 wherein said driven level has said second logic state.

19. The method of claim 15 and further comprising adjusting said voltage toward a different predetermined level having said first logic state in response to said voltage being within said different range of voltages having said first logic state.

* * * * *